(12) United States Patent
Park et al.

(10) Patent No.: US 10,267,864 B2
(45) Date of Patent: Apr. 23, 2019

(54) BATTERY MANAGEMENT SYSTEM INCLUDING APPARATUS FOR ESTIMATING BATTERY STATE

(71) Applicant: LG CHEM, LTD., Seoul (KR)

(72) Inventors: Kyu-Ha Park, Seoul (KR); Cheol-Taek Kim, Daejeon (KR)

(73) Assignee: LG Chem, Ltd. (KR)

( * ) Notice: Subject to any disclaimer, the term of this patent is extended or adjusted under 35 U.S.C. 154(b) by 884 days.

(21) Appl. No.: 14/081,711

(22) Filed: Nov. 15, 2013

(65) Prior Publication Data

US 2014/0074416 A1    Mar. 13, 2014

Related U.S. Application Data

(63) Continuation of application No. PCT/KR2013/002087, filed on Mar. 15, 2013.

(30) Foreign Application Priority Data

Mar. 16, 2012 (KR) ........................ 10-2012-0027284

(51) Int. Cl.
*G01R 31/36* (2006.01)
*G01R 31/3842* (2019.01)
(Continued)

(52) U.S. Cl.
CPC ....... *G01R 31/3842* (2019.01); *G01R 31/367* (2019.01); *G01R 31/392* (2019.01)

(58) Field of Classification Search
CPC .............. G01R 31/36; G01R 31/3651; G01R 31/3648; G01R 31/3624; G01R 31/361; G01R 31/3679
(Continued)

(56) References Cited

U.S. PATENT DOCUMENTS 6,621,250 B1    9/2003  Ohkubo et al.
2007/0029973 A1  2/2007  Ashizawa et al.
(Continued)

FOREIGN PATENT DOCUMENTS

CN         1230962 C      12/2005
JP      2002-238181 A      8/2002
(Continued)

OTHER PUBLICATIONS

Kim et al., "The Determination of State of Charge Based on Extended Kalman Filter Using Per-Unit System and Time Constant Principle," INTELEC 09: 31st International Telecommunications Energy Conference, Korea, Oct. 18-22, 2009, IEEE, NJ, USA, Oct. 18, 2009, pp. 1-5.

(Continued)

*Primary Examiner* — Leslie J Evanisko
(74) *Attorney, Agent, or Firm* — Lerner, David, Littenberg, Krumholz & Mentlik, LLP

(57) ABSTRACT

Disclosed is an apparatus and method for estimating a battery state, the apparatus including a measurement unit for measuring a terminal voltage, a charging/discharging current and a current offset value of a battery, a prediction unit for predicting a state variable and an output variable according to a state equation including SOC and an overpotential of the battery as state variables and includes a terminal voltage of the battery as an output variable, a correction unit for correcting the predicted state variable, a SOC estimation unit for estimating SOC of the battery by means of the corrected state variable, and a control unit for selecting a single state variable to estimate SOC of the battery according to the measured current offset value, so that the SOC estimation unit estimates SOC of the battery by means of the selected state variable.

9 Claims, 1 Drawing Sheet

(51) Int. Cl.
*G01R 31/367* (2019.01)
*G01R 31/392* (2019.01)

(58) Field of Classification Search
USPC .......................................... 702/63; 320/132
See application file for complete search history.

(56) References Cited

U.S. PATENT DOCUMENTS

| | | | |
|---|---|---|---|
| 2007/0188143 | A1 | 8/2007 | Plett |
| 2007/0299620 | A1 | 12/2007 | Yun et al. |
| 2011/0257914 | A1* | 10/2011 | Tsuchiya ............ G01R 31/3651 702/63 |
| 2014/0236511 | A1* | 8/2014 | Kulkarni .............. G01R 31/362 702/63 |

FOREIGN PATENT DOCUMENTS

| | | |
|---|---|---|
| JP | 2007-57399 A | 3/2007 |
| JP | 2009-526220 A | 7/2009 |
| JP | 2010-203854 A | 9/2010 |
| KR | 10-2007-0029936 A | 3/2007 |
| KR | 10-2008-0000160 A | 1/2008 |
| KR | 10-2008-0054078 A | 6/2008 |
| KR | 10-2010-0078842 A | 7/2010 |
| KR | 10-2012-0004670 A | 1/2012 |

OTHER PUBLICATIONS

Plett, "Extended Kalman Filtering for Battery Management Systems of LiPB-Based HEV Battery Packs—Part 2. Modeling and Identification," Journal of Power Sources, Elsevier, vol. 134, No. 2, Aug. 12, 2004 (available online May 28, 2004), pp. 262-276.

Tingting et al., "Analysis on the Influence of Measurement Error on State of Charge Estimation of LiFePO4 Power Battery," 2011 International Conference on Materials for Renewable Energy & Environment (ICMREE), IEEE, May 20, 2011, pp. 644-649.

Li et al., "Research on the calculating method of residual capacity available for Li-ion battery", Chinese Battery Industry, vol. 15, No. 5, Oct. 2010, pp. 259-262, with English abstract provided.

International Search Report issued in PCT/KR2013/002087, dated Jul. 18, 2013.

\* cited by examiner

BATTERY MANAGEMENT SYSTEM INCLUDING APPARATUS FOR ESTIMATING BATTERY STATE

CROSS-REFERENCE TO RELATED APPLICATION

The present application is a continuation of International Application No. PCT/KR2013/002087 filed on Mar. 15, 2013, which claims priority to Korean Patent Application No. 10-2012-0027284 filed in the Republic of Korea on Mar. 16, 2012, the disclosures of which are incorporated herein by reference.

TECHNICAL HELD

The present disclosure relates to an apparatus and method for estimating a battery state, and more particularly, to an apparatus and method for estimating a more accurate battery state such as a state of charge (SOC) of a battery by using an extended Kalman filter in consideration of a current offset of a current sensor included in the battery.

BACKGROUND ART

Recently, with the active development of storage batteries, robots, satellites, and the like, along with the dramatically increasing demand for portable electronic products such as laptop computers, video cameras, mobile phones, and the like, research and development for high-performance secondary batteries capable of repeatedly charging and discharging has been actively made.

Currently, nickel-cadmium batteries, nickel-metal hydride batteries, nickel-zinc batteries, lithium secondary batteries, and the like are used as commercial secondary batteries. Among them, lithium secondary batteries have little to no memory effect in comparison with nickel-based secondary batteries, and thus lithium secondary batteries are gaining a lot of attention for their advantages of free charging/discharging, low self-discharging, and high energy density.

Particularly, with the steady exhaustion of carbon energy and increasing interest in the environment, the demand for hybrid vehicles and electric vehicles is recently gradually increasing all over the world including United States, Europe, Japan, and the Republic of Korea. Hybrid vehicles and electric vehicles are supplied with power for driving the vehicles from the charging/discharging energy of battery packs. Therefore, in comparison with vehicles powered by an engine alone, they have higher fuel efficiency and can eliminate or lessen the emission of pollutants, which adds to the appeal of hybrid vehicles and electric vehicles. Accordingly, research and development for vehicle batteries essential to hybrid vehicles and electric vehicles have intensified with gaining interest.

As described above, a battery is used for various kinds of mobile devices such as a notebook or a vehicle and has a limit in service time. Therefore, it is important to check accurate information of the SOC of the battery. The SOC is useful in weighing up an available service time of the battery and therefore is considered to be very important information to a user of the corresponding device. For this reason, a general device using a battery such as a notebook, a cellular phone or a vehicle estimates SOC of the battery, checks an available service time or capacity of the battery from the estimated SOC, and provides the information to the user.

The SOC of a battery generally represents a residual capacity as a percentage of Full Charge Capacity (FCC) of the battery. In order to estimate the SOC of a battery, various methods may be used; however, the most representative method is estimating the SOC by means of current integration. In the current integration, input/output currents of the battery are accumulated and added or subtracted to/from an initial capacity to obtain the SOC.

In this current integration method, since SOC is estimated from a current measured by a current sensor installed on a charge/discharge path of the battery, accurate sensing of the current sensor is very important. However, the current sensor may cause a current offset between an actual current and a measured current value due to degradation. If such a current offset occurs, an actual SOC may be different from the estimated SOC due to a current offset value which is a difference between the measured current value and the actual current value. In particular, when SOC of a battery is estimated using an algorithm such as a Kalman filter, the difference in SOC caused by such a current offset value is continually accumulated, which gradually increases an error of the estimated SOC value. However, a conventional SOC estimation technique does not consider such a current offset when estimating SOC, which results in inaccurate estimation of SOC.

If a battery state such as SOC is not accurately estimated due to a current offset as described above, serious inconvenience or damage may be caused to a user. In particular, in case of a battery used for an electric vehicle, if SOC of the battery is estimated excessively higher than its actual value, the user may not charge the battery as the user may not be able to predict exhaustion of SOC of the battery, which may cause the battery to fully discharge while the vehicle is running. In addition, a battery fully discharging while a vehicle is running can lead to many inconveniences such as vehicles being towed or even traffic accidents.

DISCLOSURE

Technical Problem

The present disclosure is designed to solve the problems of the related art, and therefore the present disclosure is directed to providing an apparatus and method which may more accurately estimate a battery state such as a state of charge (SOC) of a battery by using an extended Kalman filter by determining whether to trust a current sensor or a battery model according to a current offset of the current sensor.

Other objects and advantages of the present disclosure will be understood from the following descriptions and become apparent by the embodiments of the present disclosure. In addition, it is understood that the objects and advantages of the present disclosure may be implemented by components defined in the appended claims or their combinations.

Technical Solution

In one aspect of the present disclosure, there is provided an apparatus for estimating a battery state, which includes a measurement unit for measuring a terminal voltage, a charging/discharging current and a current offset value of a battery; a prediction unit for predicting a state variable and an output variable by using a state equation which includes a state of charge (SOC) and an overpotential of the battery as state variables and includes a terminal voltage of the battery as an output variable; a correction unit for correcting the predicted state variable by comparing the predicted output variable with an output variable measured by the measurement unit; a SOC estimation unit for estimating SOC of the battery by means of the corrected state variable; and a control unit for selecting a single state variable to estimate SOC of the battery according to the measured current offset value, so that the SOC estimation unit estimates SOC of the battery by means of the selected state variable.

Preferably, when the measured current offset value is greater than a reference value, the control unit may select the overpotential as a state variable for estimating the SOC, so that the SOC estimation unit estimates SOC of the battery by means of the corrected overpotential.

Also preferably, the SOC estimation unit may calculate an open circuit voltage (OCV) of the battery by means of the corrected overpotential and estimate SOC of the battery by means of the calculated OCV.

Also preferably, when the measured current offset value is not greater than the reference value, the control unit may select SOC as a state variable for estimating the SOC, so that the SOC estimation unit estimates the corrected SOC as SOC of the battery.

Also preferably, the apparatus for estimating a battery state may further include a SOH estimation unit for estimating SOH of the battery according to the SOC estimated by the SOC estimation unit.

In another aspect of the present disclosure, there is also provided a battery management system, which includes the apparatus for estimating a battery state as described above.

In another aspect of the present disclosure, there is also provided a vehicle, which includes the apparatus for estimating a battery state as described above.

In another aspect of the present disclosure, there is also provided a method for estimating a battery state, which includes measuring a terminal voltage, a charging/discharging current and a current offset value of a battery; predicting a state variable and an output variable by using a state equation which includes SOC and an overpotential of the battery as state variables and includes a terminal voltage of the battery as an output variable; correcting the predicted state variable by comparing the predicted output variable with a measured output variable; and selecting a single state variable to estimate SOC of the battery according to the measured current offset value and estimating SOC of the battery by means of the selected state variable.

Advantageous Effects

According to the present disclosure, since a battery state such as SOC is estimated using an extended Kalman filter, the battery state may be estimated more accurately. In particular, even though a current sensor for estimating a charging/discharging current of a battery has a current offset value, the SOC of the battery may be accurately estimated. In other words, since whether to estimate an SOC according to a measured current value or an overpotential value is determined based on a current offset value, a battery state may be more accurately estimated in consideration of a current offset.

In particular, according to an embodiment of the present disclosure, if the current offset value is greater than a reference value, SOC is determined by means of the overpotential value included in a state variable, while if the current offset value is not greater than the reference value, the estimated SOC value is determined according to SOC included in the state variable. Therefore, if the current offset value exceeds a certain level, SOC of the battery is estimated depending on the battery model, while if the current offset value is not greater than a certain level, SOC of the battery is estimated depending on the current sensor. Therefore, SOC may be suitably estimated according to the current offset.

For this reason, since a user may be provided with a full-discharge point of a battery despite an offset of a current sensor, a user may better cope with a full-discharge state by charging the battery or the like, thereby preventing any unexpected accidents, damages or similar inconveniences.

DESCRIPTION OF DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
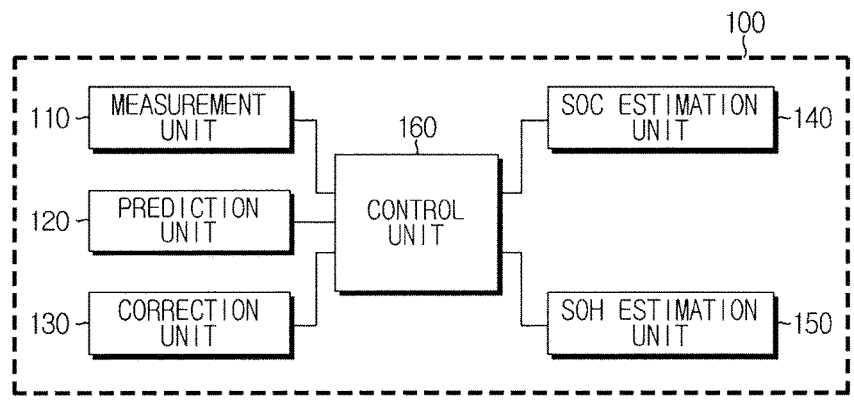
FIG. 1 is a block diagram schematically showing a function configuration of an apparatus for estimating a battery state according to an embodiment of the present disclosure.

FIG. 1 is a block diagram schematically showing a function configuration of an apparatus for estimating a battery state (hereinafter, also referred to as a "battery state estimating apparatus") according to an embodiment of the present disclosure.

Referring to FIG. 1, the battery state estimating apparatus according to the present disclosure may include a measurement unit 110, a prediction unit 120, a correction unit 130, a control unit 160 and a SOC estimation unit 140.

The measurement unit 110 measures a terminal voltage and a charging/discharging current of a battery. At this time, the charging/discharging current of a battery may be measured by a current measurement unit provided at a conventional battery pack, such as a current sensor.

In particular, the measurement unit 110 according to the present disclosure measures a current offset value of a battery. Here, the current offset value of a battery means a difference between a measured current value and an actual current value flowing along a charge/discharge path of the battery, which is caused by an offset of the current sensor (the current measurement unit). For example, in the case a current does not actually flow along the charge/discharge path of a battery but the current sensor measures that a current of 2 A flows, the current offset value may be regarded as 2 A. This current offset phenomenon may occur due to degradation of the current sensor or the like.

The measurement unit 110 may measure the current offset value in various ways, for example by measuring a voltage of the battery. For example, when a current does not flow through a battery, the measurement unit 110 may determine the current offset value by measuring a value sensed by the current sensor.

The prediction unit 120 and the correction unit 130 predict and correct a state variable and an output variable by using an algorithm. In particular, the prediction unit 120 and the correction unit 130 according to the present disclosure may use an extended Kalman filter as an algorithm for predicting and correcting the state variable and the output variable.

The Kalman filter is one of the techniques for modeling operations of a battery and predicting SOC based on the model and circularly predicts an internal state of a dynamic system by using output values of a system. The extended Kalman filter uses the basic principle of the Kalman filter and is applied to a non-linear function, instead of a linear function. In the present disclosure, SOC of a battery is estimated by using the extended Kalman filter. The principle of the extended Kalman filter is well known in the art, and this specification will focus on the distinctive features of the present disclosure.

The prediction unit 120 predicts a state variable and an output variable by using a state equation. Here, the state equation may include a system equation in relation with the state variable and a measurement equation in relation with the output variable. In particular, the state variable of the state equation may include SOC and overpotential of a battery, and the output variable of the state equation may include a terminal voltage of the battery.

The general state equation of the extended Kalman filter used in the prediction unit 120 of the present disclosure may be expressed like Equations 1 and 2 below.

$$x_{k+1} = f(x_k, u_k) + w_k \qquad \text{Equation 1}$$

$$y_k = g(x_k) + z_k \qquad \text{Equation 2}$$

Equation 1 is a general system equation of the extended Kalman filter, and Equation 2 is a general measurement equation.

Here, k represents a time step. In addition, $x_k$ represents a state variable which is to be estimated, $u_k$ is a current of the battery, and $w_k$ is a system noise component. In addition, $y_k$ is an output variable which may be measured, and $z_k$ is a measurement noise component.

With respect to the state equation, the prediction unit 120 according to the present disclosure may include SOC and overpotential of the battery as a state variable and include a terminal voltage of the battery as an output variable. Here, SOC of the battery represents a state of charge of the battery, and the overpotential of the battery means a value obtained by subtracting an open circuit voltage (OCV) from the terminal voltage of the battery.

Therefore, the state equation used in the prediction unit 120 according to the present disclosure may be more concretely expressed like Equations 3 and 4 below.

$$\begin{bmatrix} x_{1(k+1)} \\ x_{2(k+1)} \end{bmatrix} = \begin{bmatrix} 1 & 0 \\ 0 & C \end{bmatrix} \begin{bmatrix} x_{1(k)} \\ x_{2(k)} \end{bmatrix} + \begin{bmatrix} \alpha_{ekf} & 0 \\ A & -B \end{bmatrix} \begin{bmatrix} u_{1(k)} \\ u_{2(k)} \end{bmatrix} + \begin{bmatrix} w_{1(k)} \\ w_{2(k)} \end{bmatrix} \qquad \text{Equation 3}$$

$$y_{(k)} = [H_1 \; 1] \begin{bmatrix} x_{1(k)} \\ x_{2(k)} \end{bmatrix} \qquad \text{Equation 4}$$

In Equations 3 and 4, k represents a time step, $x_{1(k+1)}$ and $x_{2(k+1)}$ respectively represents SOC and overpotential of a present stage, namely predicted values of SOC and overpotential, and $x_{1(k)}$ and $x_{2(k)}$ respectively represent SOC and overpotential of a previous stage. In addition, $u_{1(k)}$ and $u_{2(k)}$ respectively represent a present battery current and a previous battery current, and $w_{1(k)}$ and $w_{2(k)}$ represent system noise components. Moreover, A, B and C are variables representing characteristics of a battery, such as battery resistance and capacitance, which may be determined through experiments. Further, $\alpha_{ckf}$ is a variable in relation with capacity of the battery, which may be determined through experiments.

In addition, $y_k$ represents a terminal voltage of the battery, and $H_1$ is a variable representing a correlation between SOC and OCV, which may be determined through experiments.

The prediction unit 120 may predict a state variable by using a system equation like Equation 3 and predict an output variable by using an output equation like Equation 4.

In particular, in a first stage, the prediction unit 120 may predict a state variable in relation with SOC and overpotential by using the input of an initial parameter. However, in the following stages, the prediction unit 120 may predict a state variable by means of the state variable corrected by the correction unit 130.

In addition, the prediction unit 120 may predict a dispersion of errors caused by state variable estimation, namely estimated error dispersion. At this time, the estimated error dispersion ($P_k$) may be calculated according to Equation 5 below.

$$P_k = A_{k-1} P_{k-1} A_{k-1}^T + WQW^T \qquad \text{Equation 5}$$

Here, $A_{k-1}$ represents $$\begin{bmatrix} 1 & 0 \\ 0 & C \end{bmatrix},$$

and $A_{k-1}^T$ represents a transposed matrix of $A_{k-1}$. In addition, W represents $$\begin{bmatrix} w_1 \\ w_2 \end{bmatrix},$$

Q represents a process noise parameter, and $WQW^T$ represents a dispersion value of system noise.

The correction unit 130 compares the output variable predicted by the prediction unit 120 with the output variable measured by the measurement unit 110. In addition, the correction unit 130 corrects the predicted state variable by means of the comparison result.

For this, the correction unit 130 may generate a Kalman gain ($K_k$), namely a gain factor, by using Equation 6 below.

$$K_k = \frac{P_k C_k^T}{P_k C_k^T + VRV^T} \qquad \text{Equation 6}$$

Here, $P_k$ represents estimated error dispersion, and $C_k$ represents [H1 1]. In addition, V and R represent measurement noise parameters, and $VRV^T$ a dispersion value of measurement noise.

If the gain factor is obtained as described above, the correction unit 130 may correct the predicted state variable by means of the predicted output variable and the measured output variable together with the gain factor as in Equation 7 below.

$$x_k' = x_k + K_k[y_k - g(x_k, u_k)] \qquad \text{Equation 7}$$

Here, $x_k'$ represents a predicted state variable, $x_k$ represents a corrected value, and $K_k$ represents a gain factor, namely a Kalman gain. In addition, $y_k$ represents a measured output variable, namely a measured battery terminal voltage, and $g(x_k, u_k)$ represents an output variable predicted by the prediction unit 120, namely a predicted battery terminal voltage.

If the predicted state variable is corrected as described above, the corrected state variable may be input as a previous value for predicting a state variable of a next stage. For example, $x_k'$ of Equation 7 may be input as $x_k$ of Equation 1 and used to predict a state variable $x_{(k+1)}$ of a next stage.

In addition, the correction unit 130 may correct the estimated error dispersion predicted by the prediction unit 120 by using the Kalman gain, as expressed in Equation 8 below.

$$P_k' = (1 - K_k C_k) P_k \qquad \text{Equation 8}$$

Here, $P_k'$ represents a corrected value of the predicted estimated error dispersion, $P_k$, and $K_k$ represents a Kalman gain. In addition, $C_k$ represents [H1 1]

If the predicted estimated error dispersion is corrected as described above, the corrected estimated error dispersion may be input as a previous value for predicting an estimated error dispersion of a next stage. For example, $P_k'$ of Equation 8 may be input as $P_{k-1}$ of Equation 5 and used to predict an estimated error dispersion $P_k$ of a next stage.

The SOC estimation unit 140 estimates SOC of the battery by means of the state variable corrected by the correction unit 130. Here, the state variable corrected by the correction unit 130 may include SOC and overpotential. Therefore, the SOC estimation unit 140 may estimate SOC by means of the SOC corrected by the correction unit 130 or the overpotential corrected by the correction unit 130.

The control unit 160 selects a single state variable for estimating SOC of the battery according to the current offset value measured by the measurement unit 110. In other words, the SOC estimation unit 140 uses the corrected SOC or the corrected overpotential as a state variable in order to estimate SOC, and the control unit 160 may select which state variable is used between them.

Therefore, the control unit 160 may select one of the corrected SOC and the corrected overpotential and allow the SOC estimation unit 140 to estimate SOC of the battery by means of the selected state variable.

At this time, the control unit 160 according to the present disclosure may determine which state variable is used to estimate SOC of the battery according to the current offset value measured by the measurement unit 110.

For this, the control unit 160 may compare the measured current offset value with a reference value. Here, the reference value is a current value to be compared with the measured value having a current offset and may be a predetermined value. The reference value may be a maximum value of current errors with which the current value measured by the current sensor may be regarded reliable when estimating SOC of the battery.

For example, the reference value may be 0 A. In this case, the state variable for estimating SOC may be different depending on the presence of the current offset value. The reference value having a current offset may be stored in advance in a memory provided at the inside or outside of the control unit 160.

Preferably, if the current offset value measured by the measurement unit 110 is greater than a predetermined reference value, the control unit 160 selects the overpotential as a state variable for estimating SOC. Therefore, in this case, the SOC estimation unit 140 may estimate SOC of the battery by means of the overpotential corrected by the correction unit 130.

For example, $x_{2(k+1)}$ which is a state variable in relation with the overpotential in Equation 3 may be corrected by Equation 7 and used to estimate SOC of the battery.

In more detail, the SOC estimation unit 140 may calculate an open circuit voltage (OCV) of the battery by means of the corrected overpotential and estimate SOC of the battery by means of the calculated OCV. Here, the relation between OCV and SOC of the battery may be stored in a storage device such as a memory provided at the inside or outside of the control unit 160 in a form of a mathematical formula or table, by means of experimental measurement or the like.

The predicted and corrected SOC($x_{1(k)}$) included as a state variable is determined by means of the measured current value. However, if the current offset value is greater than the reference value, the current sensor is not reliable and thus it is inevitable that the SOC determined by means of the measured current value has many errors from the actual SOC. Therefore, according to the embodiment of the present disclosure, when the current offset value is greater than the reference value, the corrected overpotential is used as a state variable instead of the corrected SOC to estimate SOC, thereby allowing more accurate estimation of SOC. In other words, according to this embodiment, if the current offset value is greater than the reference value, SOC of the battery is estimated depending on the battery model, while the current sensor is not trusted.

Also preferably, if the current offset value measured by the measurement unit 110 is not greater than the reference value, the control unit 160 may select SOC as a state variable for estimating SOC. Therefore, in this case, the SOC estimation unit 140 may estimate the SOC corrected by the correction unit 130 as SOC of the battery.

For example, a value obtained by correcting $x_{1(k+1)}$, predicted in Equation 3 for SOC, according to Equation 7 may be calculated as an estimated SOC value of the battery.

If the current offset value is not greater than the reference value, the current offset is regarded negligible. Therefore, in this case, the predicted and corrected SOC included as a state variable may be intactly regarded as an estimated SOC value of the battery. In other words, if the current offset value is not greater than the reference value, the current sensor may be trusted and the SOC determined by means of the measured current value may be used as an estimated SOC value of the battery.

As described above, the control unit 160 may determine which state variable is used to estimate SOC. In particular, the control unit 160 may determine which state variable is used, by changing a system noise component of the state equation.

For example, in Equation 3, $w_{1(k)}$ and $w_{2(k)}$ represent system noise components, and the control unit 160 may determine which state variable is used to estimate SOC by changing $w_{1(k)}$ and $w_{2(k)}$.

At this time, control unit 160 may determine which state variable is used to estimate SOC, by changing a ratio of the system noise component with respect to state variables in the state equation according to the measured current offset value.

For example, it is assumed that the reference value for the current offset value is 0 A and the measured current offset value is 2 A. At this time, since the measured current offset value is greater than the reference value, the control unit 160 may select overpotential as a state variable for estimating SOC. For this, the control unit 160 may change a ratio of $w_{1(k)}$ which is a system noise component with respect to the state variable $x_{1(k)}$ to $w_{2(k)}$ which is a system noise component with respect to the state variable $x_{2(k)}$, for SOC, namely $w_{1(k)}:w_{2(k)}$.

In more detail, when the current offset value is 0 A, the control unit 160 sets $w_{1(k)}:w_{2(k)}$ as 1:0.1, and then if the current offset value is 2 A greater than the reference value, the control unit 160 may change $w_{1(k)}:w_{2(k)}$ into 1:0.01. In other words, if the current offset value is greater than the reference value, the control unit may change a parameter $w_2$ from 0.1 to 0.01 in the meaning that the current sensor is not trusted but the battery model is trusted. In addition, in this case, if the current offset value becomes smaller than the reference value later, the control unit may change the parameter $w_2$ from 0.01 to 0.1 again so that the current sensor is trusted and a sensed current value may give an influence on the algorithm.

In other words, if the current offset value becomes smaller than the reference value later, the control unit 160 increases the size of $w_{1(k)}$ with respect to $w_{2(k)}$, thereby allowing SOC to be estimated according to $x_{1(k)}$.

Also preferably, the measurement unit 110 may measure a temperature of the battery. In this case, the control unit 160 may change a ratio of the system noise component with respect to state variables according to the battery temperature measured by the measurement unit 110.

At this time, more preferably, if the measured battery temperature is not higher than a predetermined temperature, the control unit 160 may select SOC as a state variable for estimating SOC of the battery. In this case, the control unit 160 may allow the SOC estimation unit 140 to estimate the corrected SOC according to Equation 7 to be estimated as SOC of the battery.

If the battery temperature is low, the reliability of battery SOC estimation using OCV or the like may deteriorate. Therefore, in this embodiment, if the battery temperature is lower than a predetermined level, the SOC predicted and corrected as a state variable may be intactly used as the estimated SOC value of the battery. In other words, if the battery temperature is not higher than a predetermined temperature, the battery model according to OCV of the battery is not trusted, but the current sensor is trusted.

Therefore, at this time, the predetermined temperature may be experimentally determined in advance as a lowest temperature which represents a maximum error allowable when estimating SOC of the battery according to OCV. The predetermined temperature may be stored in advance in a memory provided at the inside or outside of the control unit 160.

For example, if the predetermined temperature is determined as 0° C. and the battery temperature measured by the measurement unit 110 is 0° C. or below, the control unit 160 may calculate a value obtained by correcting the state variable $x_{1(k+1)}$ for SOC of Equation 3 according to Equation 7 as the estimated SOC value.

Preferably, the battery state estimating apparatus according to the present disclosure may further include a SOH estimation unit 150. The SOH estimation unit 150 may estimate a state of health (SOH) of the battery by means of the SOC estimated by the SOC estimation unit 140.

The performance of the battery such as power and capacity may degrade due to continuous use, and therefore SOH of the battery may continuously decrease. The SOH of the battery may be estimated according to the SOC of the battery, which is obvious to those skilled in the art and not described in detail here. According to the present disclosure, since SOC of the battery is estimated in consideration of a current offset and SOH of the battery is estimated according to the estimated SOC, the current offset may also be considered when estimating the SOH. Therefore, according to the embodiment of the present disclosure, SOH of the battery may be predicted more accurately in consideration of the current offset.

Meanwhile, the battery state estimating apparatus according to the present disclosure may be implemented as being included in a battery management system (BMS) 100 of a battery pack. In other words, the battery management system 100 according to the present disclosure may include the battery state estimating apparatus described above. Here, the battery management system 100 is a management device for controlling charging/discharging operations of a battery pack as a whole, and such a BMS is generally included in a battery pack protection device. In particular, the BMS may include a micro controller unit (MCU), and the control unit 160 of the battery state estimating apparatus may be implemented using such a MCU.

In addition, the battery state estimating apparatus according to the present disclosure may be included in a vehicle. In particular, an electric vehicle, including a hybrid vehicle, supplies a driving power of a motor by using a battery, and thus it is very important to estimate a battery state such as SOC when operating the battery. Since the vehicle according to the present disclosure includes the battery state estimating apparatus described above, even though an offset of a current sensor occurs, SOC and SOH of the battery may be estimated more accurately.

Figure 2:
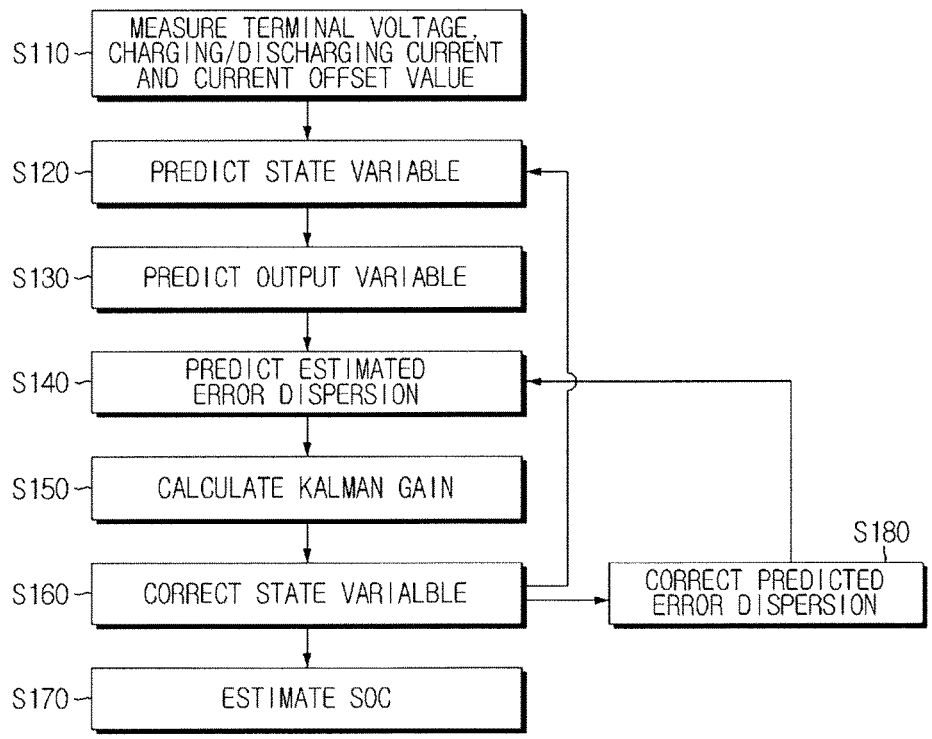
FIG. 2 is a schematic flowchart for illustrating a method for estimating a battery state according to an embodiment of the present disclosure.

FIG. 2 is a schematic flowchart for illustrating a method for estimating a battery state according to an embodiment of the present disclosure. In FIG. 2, a subject of each operation may be a component of the battery state estimating apparatus described above.

As shown in FIG. 2, the method for estimating a battery state according to the present disclosure measures a terminal voltage, a charging/discharging current and a current offset value of a battery (S110). Here, the terminal voltage, the charging/discharging current and the current offset value of a battery does not have to be measured at the same time. In particular, it is not mandatory to measure the terminal voltage or the current offset value of the battery before Step S120.

Next, a state equation including SOC and overpotential of the battery as a state variable, namely a system equation, is set and a measured current value is input thereto to predict a state variable (S120). At this time, at a first stage, an initial parameter of the battery may be input as the state variable.

In addition, a predicted state variable is input to a state equation including a terminal voltage of the battery as an output variable, namely an output equation, to predict an output variable (S130).

Next, the output variable predicted as above is compared with the measured output variable to correct the predicted state variable (S160). In other words, the terminal voltage of the battery predicted in Step S130 is compared with the terminal voltage of the battery measured in Step S110, and the predicted state variable may be corrected according to the comparison result in Step S120.

For this, after Step S130, an estimated error dispersion $P_k$ may be predicted (S140), and a Kalman gain $K_k$ may be calculated as a gain factor by means of the estimated error dispersion result (S150). In addition, the Kalman gain calculated in Step S150 may be used to correct the state variable in Step S160 together with the terminal voltage predicted in Step S130 and the terminal voltage measured in Step S110.

If the state variable is corrected as described above, SOC is estimated by means of the corrected state variable (S170). However, the corrected state variable may include a state variable in relation with SOC of the battery and a state variable in relation with overpotential of the battery, and one of these state variables may be selected to estimate SOC of the battery in Step S170. At this time, the state variable may be selected according to the current offset value measured in Step S110. In other words, in Step S170, a single state variable is selected to estimate SOC of the battery according to the current offset value of the battery, and SOC of the battery is estimated by means of the selected state variable. For example, if the current offset value measured in Step S110 is greater than the reference value, in Step S170, SOC may be estimated by means of the corrected overpotential.

Meanwhile, the state variable corrected in Step S160 may be input as a previous value in Step S120 and used to predict a state variable of a next stage.

In addition, after Step S160, the estimated error dispersion may be further corrected (S180). In other words, the estimated error dispersion value predicted in Step S140 may be corrected according to the Kalman gain calculated in Step S150, and the estimated error dispersion value corrected as described above may be input as a previous value in Step S140 and used to predict an estimated error dispersion of a next stage.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

Meanwhile, even though the term "unit" has been used in the specification, the term "unit" just represents a logic component and is not limited to a physically distinguishable component, as apparent to those skilled in the art.

What is claimed is:

1. A battery management system (BMS) of a battery pack, which includes an apparatus for estimating a battery state, the battery state estimating apparatus comprising:
a measurement unit for repeatedly measuring a terminal voltage of a battery, and for repeatedly sensing, via a current sensor, both of a charging/discharging current and a current offset value of the battery;
a prediction unit for repeatedly predicting a selected state variable and a predicted output variable by using a state equation, in which the selected state variable is either a state of charge (SOC) or an overpotential of the battery, and in which the predicted output variable is a predicted terminal voltage of the battery, wherein a corrected state variable obtained previously is repeatedly received as input into the state equation in order for the prediction unit to predict the selected state variable;
a correction unit for repeatedly correcting the predicted state variable to the corrected state variable for input to the prediction unit by repeatedly comparing the predicted output variable with the terminal voltage measured by the measurement unit;
a SOC estimation unit for repeatedly estimating an estimated SOC of the battery by means of the corrected state variable; and
a control unit configured to change which selected state variable is selected for prediction by the prediction unit, by:
selecting the overpotential as the selected state variable when the current offset value sensed by the measurement unit is greater than a current offset reference value, and
selecting the SOC as the selected state variable when the current offset value sensed by the measurement unit is not greater than the current offset reference value;
wherein the BMS is configured to control charging/discharging operations of the battery pack based on the estimated SOC.

2. The BMS of the battery pack including the apparatus for estimating the battery state according to claim 1, wherein, when the overpotential is selected as the selected state variable, the SOC estimation unit calculates an open circuit voltage (OCV) of the battery by means of the overpotential corrected by the correction unit and estimates the SOC of the battery according to the calculated OCV.

3. The BMS of the battery pack including the apparatus for estimating the battery state according to claim 1, wherein the control unit changes a system noise component of the state equation according to the sensed current offset value.

4. The BMS of the battery pack including the apparatus for estimating the battery state according to claim 3, wherein the control unit changes a ratio of the system noise component with respect to the state variables according to the sensed current offset value.

5. The BMS of the battery pack including the apparatus for estimating the battery state according to claim 1, wherein the measurement unit further measures a temperature of the battery, and
wherein the control unit changes a ratio of a system noise component with respect to the state variables according to the measured temperature of the battery.

6. The BMS of the battery pack including the apparatus for estimating the battery state according to claim 5, wherein when the measured temperature of the battery is not higher than a predetermined temperature, the control unit selects the SOC as the selected state variable.

7. The BMS of the battery pack including the apparatus for estimating the battery state according to claim 1, wherein the prediction unit predicts the selected state variable by using a following equation:

$$\begin{bmatrix} x_{1(k+1)} \\ x_{2(k+1)} \end{bmatrix} = \begin{bmatrix} 1 & 0 \\ 0 & C \end{bmatrix} \begin{bmatrix} x_{1(k)} \\ x_{2(k)} \end{bmatrix} + \begin{bmatrix} \alpha_{ekf} & 0 \\ A & -B \end{bmatrix} \begin{bmatrix} u_{1(k)} \\ u_{2(k)} \end{bmatrix} + \begin{bmatrix} w_{1(k)} \\ w_{2(k)} \end{bmatrix}$$

where $x_{1(k+1)}$ and $x_{2(k+1)}$ respectively represent SOC and overpotential of a present stage, $x_{1(k)}$ and $x_{2(k)}$ respectively represent SOC and overpotential of a previous stage, $u_{1(k)}$ and $u_{2(k)}$ respectively represent a present battery current and a previous battery current, $w_{1(k)}$ and $w_{2(k)}$ represent system noise components, A, B and C are variables in relation with battery characteristics, $\alpha_{ekf}$ is a variable in relation with battery capacity, and k represents a time step.

8. The BMS of the battery pack including the apparatus for estimating the battery state according to claim 1, wherein the correction unit corrects the predicted state variable by means of a gain factor, the predicted output variable, and the terminal voltage measured by the measurement unit.

9. The BMS of the battery pack including the apparatus for estimating the battery state according to claim 1, wherein the battery state estimating apparatus further comprises a state of health (SOH) estimation unit for estimating SOH of the battery according to the estimated SOC estimated by the SOC estimation unit.

\* \* \* \* \*